United States Patent
Brandenburg

(10) Patent No.: US 10,679,770 B1
(45) Date of Patent: Jun. 9, 2020

(54) INTERFACE LAYER WITH MESH AND SINTER PASTE

(71) Applicant: APTIV TECHNOLOGIES LIMITED, St. Michael (BB)

(72) Inventor: Scott D. Brandenburg, Kokomo, IN (US)

(73) Assignee: Aptiv Technologies Limited (BB)

( * ) Notice: Subject to any disclaimer, the term of this patent is extended or adjusted under 35 U.S.C. 154(b) by 0 days.

(21) Appl. No.: 16/599,688

(22) Filed: Oct. 11, 2019

(51) Int. Cl.
| | |
|---|---|
| *H01B 5/00* | (2006.01) |
| *H01R 43/00* | (2006.01) |
| *H01B 1/02* | (2006.01) |
| *B22F 7/06* | (2006.01) |
| *H01R 4/58* | (2006.01) |

(52) U.S. Cl.
CPC ............... *H01B 5/00* (2013.01); *B22F 7/064* (2013.01); *H01B 1/02* (2013.01); *H01R 4/58* (2013.01); *H01R 43/00* (2013.01); *B22F 2301/10* (2013.01)

(58) Field of Classification Search
CPC ... H01B 5/00; H01B 1/02; B22F 7/064; B22F 2301/10; H01R 4/58; H01R 43/00
USPC ........................................................ 174/70 R
See application file for complete search history.

(56) References Cited

U.S. PATENT DOCUMENTS

| | | | |
|---|---|---|---|
| 5,316,080 A | 5/1994 | Banks et al. | |
| 5,783,862 A * | 7/1998 | Deeney | H01L 23/3733 165/104.17 |
| 6,059,917 A * | 5/2000 | Kyle | H01L 23/3733 156/292 |
| 6,407,922 B1 | 6/2002 | Eckblad et al. | |
| 7,230,832 B2 | 6/2007 | Brandenburg et al. | |
| 7,486,515 B2 | 2/2009 | Brandenburg et al. | |
| 8,699,225 B2 | 4/2014 | Brandenburg et al. | |
| 9,131,630 B2 | 9/2015 | Brandenburg et al. | |
| 2008/0310115 A1 * | 12/2008 | Brandenburg | H01L 23/3733 361/704 |
| 2009/0208722 A1 * | 8/2009 | Timmerman | B32B 5/12 428/221 |
| 2012/0006521 A1 | 1/2012 | Moehlenkamp et al. | |
| 2014/0070393 A1 | 3/2014 | Bartley et al. | |
| 2014/0217574 A1 | 8/2014 | Kuczynski et al. | |
| 2014/0252404 A1 | 9/2014 | Takayama et al. | |
| 2017/0317005 A1 | 11/2017 | Standing | |

OTHER PUBLICATIONS

Unpublished U.S. Appl. No. 16/520,862, filed Jul. 24, 2019, Liquid Cooled Module With Device Heat Spreader, Brandenburg, Scott D.

* cited by examiner

*Primary Examiner* — Sherman Ng
(74) *Attorney, Agent, or Firm* — Joseph V. Bonadies

(57) ABSTRACT

An interface layer includes an electrically conductive compressible mesh that has wires that are interwoven and pores between the wires. A sinter paste is immobilized in the pores. The sinter paste includes electrically conductive particles.

22 Claims, 3 Drawing Sheets

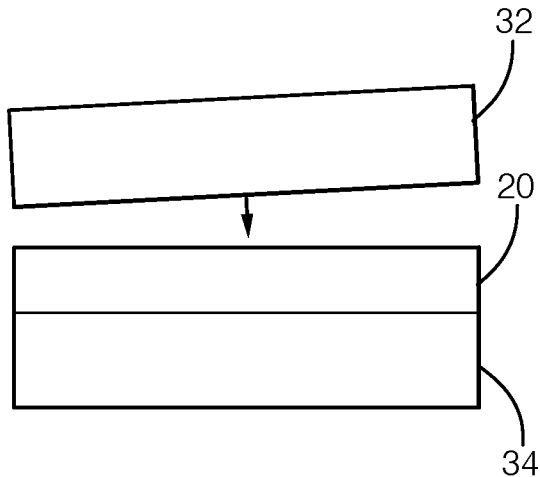
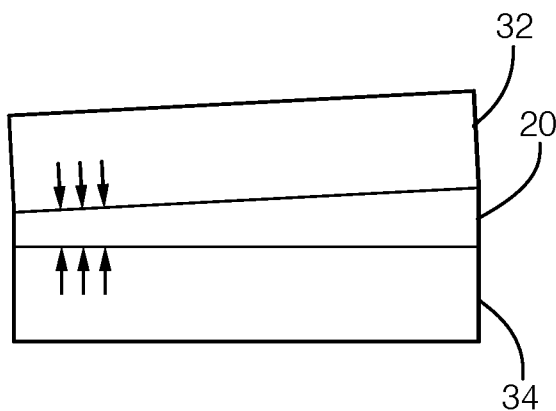
FIG. 4          FIG. 5
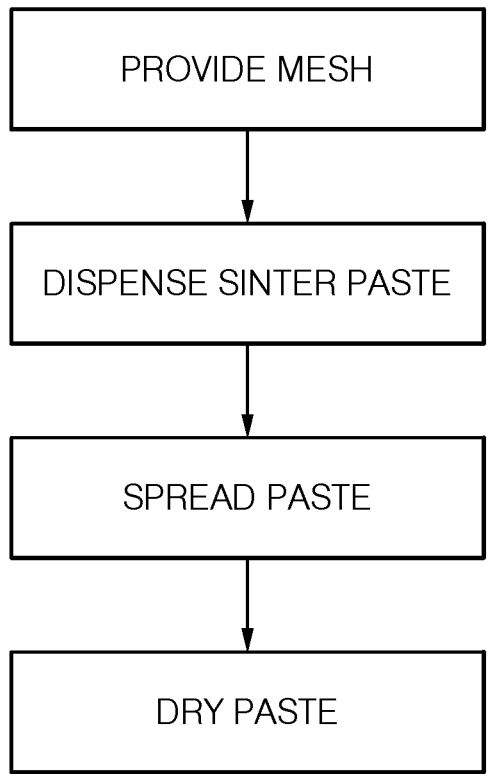
FIG. 6

INTERFACE LAYER WITH MESH AND SINTER PASTE

BACKGROUND

Electrical and thermal joints in electronic devices typically include an interface material. Solder has traditionally been used but more recently sintered materials have gained acceptance. One challenge with sintered materials is that the sintered materials provide poor compliance. For instance, when joining components, the components may have uneven surfaces or non-parallel surfaces due to manufacturing and/or processing tolerances. The solder can flow during the joining process to fill non-uniform spaces produced by the tolerances and thereby join the components entirely across the interface. The sintered materials, however, do not flow and have poor compliance. As a result, sintered materials typically have limited ability to join across the non-uniform spaces produced by the tolerances. In some instances, sintered materials may only allow for compliances of less than a thousandth of an inch.

SUMMARY

An interface layer according to an example of the present disclosure includes an electrically conductive compressible mesh that has wires that are interwoven and pores between the wires, and a sinter paste immobilized in the pores. The sinter paste includes electrically conductive particles.

In a further embodiment of any of the foregoing embodiments, the wires are copper wires.

In a further embodiment of any of the foregoing embodiments, the particles have a composition, by weight, of greater than 99% copper.

In a further embodiment of any of the foregoing embodiments, the mesh has a mesh size of 50-80.

In a further embodiment of any of the foregoing embodiments, the wires have a wire diameter of 0.05 millimeters to 0.5 millimeters.

In a further embodiment of any of the foregoing embodiments, the mesh is a plain weave.

In a further embodiment of any of the foregoing embodiments, the wires are copper wires and the particles have a composition, by weight, of greater than 99% copper.

In a further embodiment of any of the foregoing embodiments, the mesh is a plain weave.

In a further embodiment of any of the foregoing embodiments, the mesh has a mesh size of 50-80 and the wires have a wire diameter of 0.05 millimeters to 0.5 millimeters.

In a further embodiment of any of the foregoing embodiments, the mesh is a plain weave and has a mesh size of 50-80.

In a further embodiment of any of the foregoing embodiments, the wires are copper wires.

In a further embodiment of any of the foregoing embodiments, the particles have a composition, by weight, of greater than 99% copper.

In a further embodiment of any of the foregoing embodiments, the wire has a wire diameter of 0.05 millimeters to 0.5 millimeters.

An electronic device according to an example of the present disclosure includes first and second components, and an interface layer as in any of the foregoing embodiments situated between the first and second components.

A method of fabricating an electronic device according to an example of the present disclosure includes compressing an interface layer between first and second components to reduce a thickness of the interface layer. The interface layer includes an electrically conductive mesh that has wires that are interwoven, pores between the wires, and a sinter paste that is immobilized in the pores. The sinter paste includes electrically conductive particles. The interface layer is then heated to consolidate the electrically conductive particles into sintered bodies in the pores.

In a further embodiment of any of the foregoing embodiments, the heating is conducted under an inert cover gas at a temperature of 225° C. to 300° C.

In a further embodiment of any of the foregoing embodiments, the heating is pressureless heating.

In a further embodiment of any of the foregoing embodiments, the heating is conducted under a pressure of 10 MPa to 40 Mpa.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 4 illustrates the interface layer arranged between first and second components that are to be joined by the interface layer.

FIG. 5 illustrates the interface layer compressed between the first and second components.

FIG. 6 illustrates an example of the steps for fabricating the interface layer.

DETAILED DESCRIPTION

Sintered interfaces between components in electronic devices typically provide for very little compliance between the adjoined components. As will be described, the interface layer 20 disclosed herein provides a sinterable interface that has enhanced compliance to enable greater accountability for tolerances.

Figure 1:
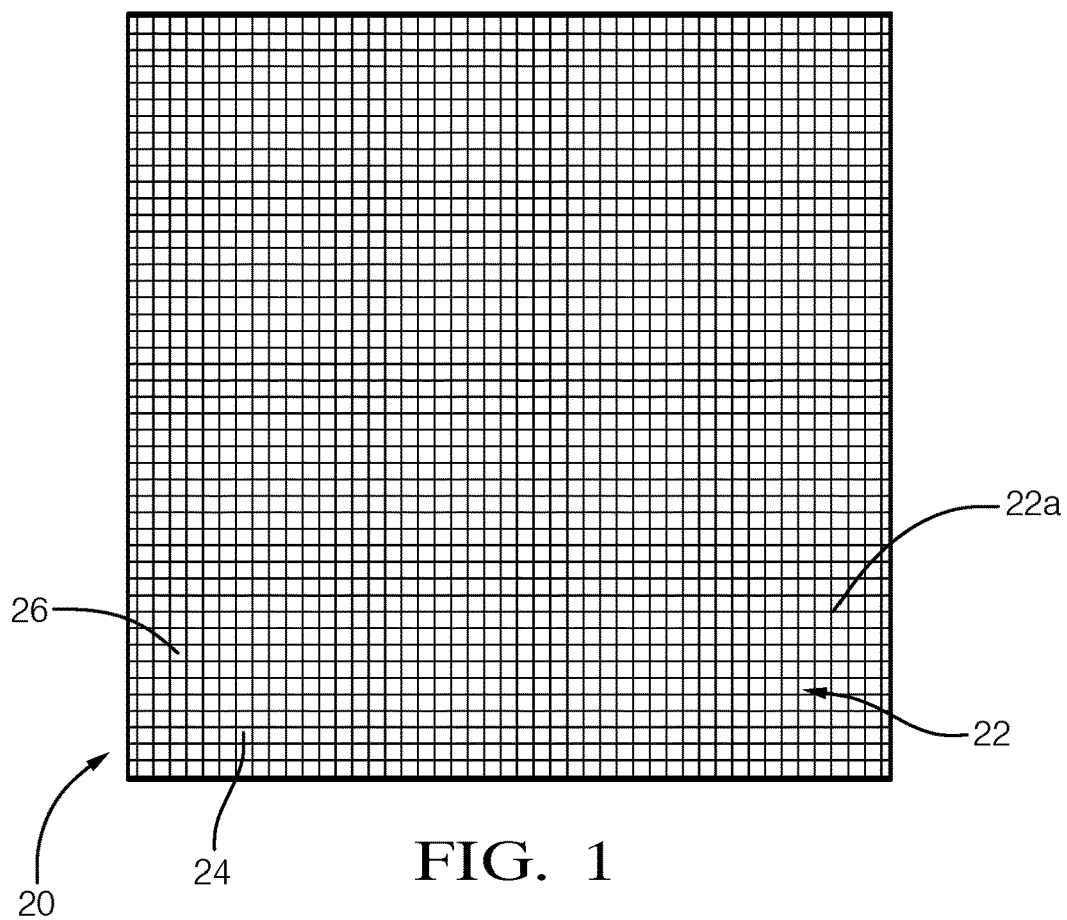
FIG. 1 illustrates an example interface layer having a wire mesh and sinter paste disposed in the mesh.
Figure 2:
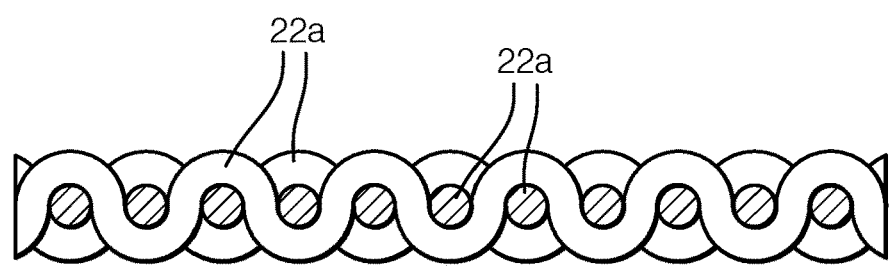
FIG. 2 illustrates a view of the wire mesh alone.

FIG. 1 schematically illustrates an example interface layer 20 for use in a joint of an electronic device. The interface layer 20 includes an electrically conductive compressible mesh 22 that is formed of a network of wires 22a that are interwoven together. As shown in FIG. 2, which is an elevation view of only the mesh 22, the wires 22a are provided in a weave. For example, the mesh 22 is provided as a plain weave. The weave is "loose" in that there are pores 24 (FIG. 1) between the wires 22a.

Figure 3:
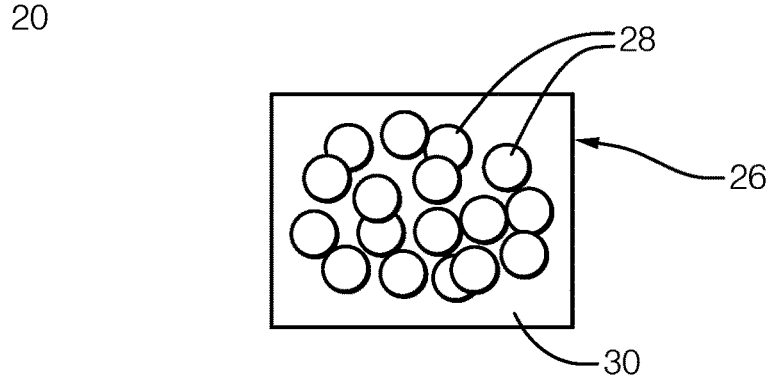
FIG. 3 illustrates an example of the sinter paste.

The interface layer 20 further includes a sinter paste 26 immobilized in the pores 24. FIG. 3 shows a representative view of the sinter paste 26. The sinter paste 26 includes electrically conductive particles 28. For example, the electrically conductive particles 28 are copper particles, such as copper particles that have a composition, by weight, of greater than 99% copper. The particles 28 may be nanoparticles, but larger, non-nanoparticle size may additionally or alternatively be used. In addition to the particles 28, the sinter paste 26 may include processing agents 30. The processing agents 30 are not particularly limited and may include such constituents as binders, resins, waxes, fluxing agents, or other agents known for use in sintering pastes.

The mesh 22 of the interface layer 20 enables the interface layer 20 to be compressed. For example, FIG. 4 schematically illustrates the interface layer 20 arranged between first and second components 32/34 that are to be joined by the interface layer 20. Notably, the components 32/34 are uneven such that the interface surfaces of the components 32/34 are non-parallel. The unevenness may be due to manufacturing and/or processing tolerances. As will be appreciated, the non-parallel scenario is merely example, and unevenness between surfaces can also take other forms.

When the components 32/34 are brought together for joining, the region on the left-hand side of component 32 in this example will first contact the interface layer 20. If an incompressible interface were used, the components 32/34 would be unable move much closer together after the initial contact, which may result in non-contact between the right-hand side of the component 32 and the incompressible interface.

However, as shown in FIG. 5, the interface layer 20 compresses in the vicinity of the initial contact with the component 32, thereby enabling the component 32 to continue to move toward the component 34. As a result of the interface layer 20 compressing, the right-hand side of the component 32 is also able to contact the interface layer 20 such that the component 32 is in full interfacial contact with the interface layer 20.

The mesh 22 of the interface layer 20 enables the compressibility. The pores 24 provide the wires 22a of the mesh 22 the ability to move in order to spread and/or deform under compression, thereby allowing the interface layer 20 to deflect. Although the pores 24 are filled with the sinter paste 26, the sinter paste 26 is relatively soft. The sinter paste 26 may shift somewhat under the compression to accommodate the spreading and/or deformation of the wires 22a. As will be appreciated given this disclosure, the combination of the type of weave, mesh size, and wire diameter may be adjusted to provide a desired amount of compression. In examples, the mesh 22 may have an area of approximately 2.54 square centimeters and a mesh size of 50-80, and the wires 22a have a wire diameter of 0.05 millimeters to 0.5 millimeters. The interface layer 20 with such characteristics may have a compression compliance of up to about 0.2 millimeters.

Figure 7:
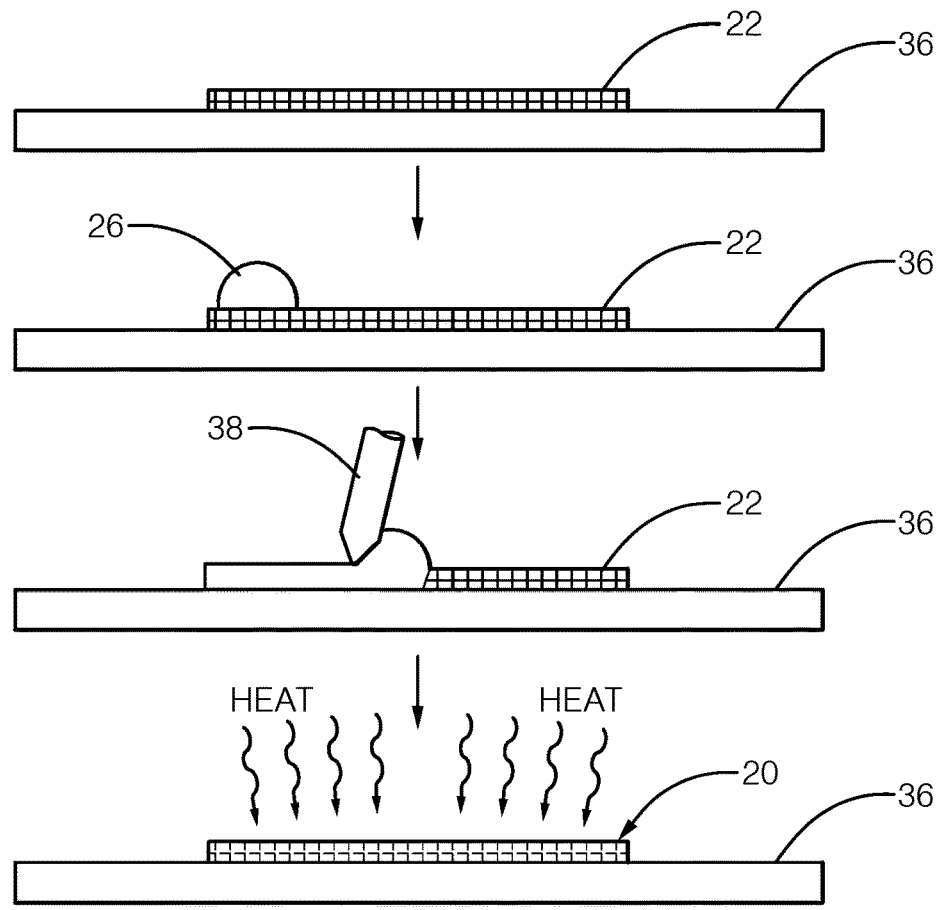
FIG. 7 depicts the interface layer during the fabrication process.

FIG. 6 illustrates steps of an example technique for fabricating the interface layer 20, and FIG. 7 depicts the interface layer 20 during the process. Initially, the mesh 22 is provided on a carrier sheet 36. For instance, the carrier sheet 36 is composed of polytetrafluoroethylene, polyester, or polyimide, but other carrier sheets may alternatively be used. The carrier sheet 36 supports the mesh 22 during processing and facilitates handling. In some examples, the carrier sheet 36 may support multiple meshes 22 for co-processing to fabricate multiple interface layers 20 at once.

Next, the sinter paste 26 is introduced onto the mesh 22. In one example, the sinter paste 26 is introduced using a screen printing process. For instance, the sinter paste 26 may initially include a carrier fluid, such as a solvent, that mobilizes the sinter paste 26 to flow or at least be more easily manipulated. The sinter paste 26 is then spread by a spreader 38, such as a squeegee, across the mesh 22. The spreading disperses the sinter paste 26 into the pores 24 of the mesh 22. In this regard, the carrier sheet 36 serves as the "floor" of the pores 24 to support the sinter paste 26 prior to being immobilized.

Lastly, the sinter paste 26 is dried to immobilize the sinter paste 26 in the pores 24. For example, the drying is conducted in a chamber at a temperature of 60° C. to 125° C. for approximately 10 minutes or more. The drying removes the carrier fluid, thereby transforming the sinter paste 26 into a more solid form that remains in the pores 24. For instance, in the more solid form, the sinter paste 26 interlocks with the wires 22a so as to remain immobilized in the mesh 22. The steps above may be repeated over multiple iterations to completely fill the pores 24.

The resulting interface layer 20 may then be provided for assembly into an electronic device. For instance, the interface layer 20 may remain on the carrier sheet 36 after fabrication. A pick-and-place machine may then be used to remove the interface layer 20 from the carrier sheet 36 and place it on one or the other of the components 32/34. The components 32/34 are then brought together, as described above, thereby compressing and reducing the thickness of the interface layer 20 so that it is in full contact with both components 32/34. For instance, the interface layer 20 may be compressed by at least 10% or more of its initial thickness, and in some cases up to 50% or close to 0% for pressureless processing.

The interface layer 20 is then subjected to a heating process to consolidate the particles 28. For example, the heating process is conducted under an inert cover gas, such as nitrogen, at a temperature of 225° C. to 300° C. for approximately 3 minutes to 15 minutes. Alternatively, the heating process can be conducted under in a hydrogen-rich environment, which may facilitate reducing any oxides that are present or that otherwise form in-process. The heating process may be conducted as a pressureless heating or with pressure. Use of pressure serves to further compress and consolidate the interface layer 20. As an example, the heating is conducted under a pressure of up to 40 Mpa, such as approximately 10 MPa, 20 MPa, or 30 MPa. Depending on the pressure, the thickness of the final interface layer 20 based on the mesh 22 having a mesh size of 50-80 and a wire diameter of 0.05 millimeters to 0.5 millimeters may be approximately 0.05 millimeters to 0.3 millimeters.

Figure 8:
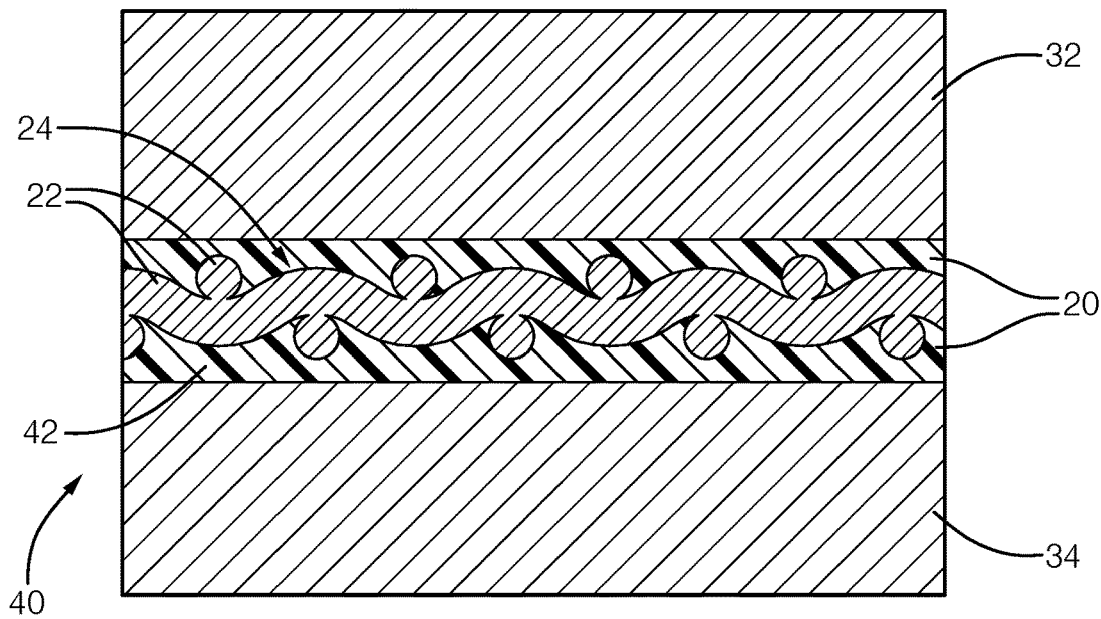
FIG. 8 illustrates a final electronic device having the interface layer.

FIG. 8 illustrates a sectioned view of representative portions of a final electronic device 40 after the fabrication process described above. The interface layer 20 is disposed between the first and second components 32/34. The heating process sintered the sinter paste 26 to produce sintered bodies 42 in the pores 24. In such sintered bodies 42, all or substantially all of the particles 28 have coalesced into a solid, continuous mass. Low levels of porosity may remain, however, the porosity may be minimized by using pressure during the sintering process. The interface layer 20 has a thermal conductivity of 180 W/m° K to 260 W/m° K. Pressureless heating may be used to obtain thermal conductivity toward the lower end of this range, while pressures of approximately 20 MPa to 40 MPa may be used to obtain thermal conductivity toward the upper end of the range.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. An interface layer comprising:
an electrically conductive compressible mesh having wires that are interwoven and pores between the wires; and
a sinter paste immobilized in the pores, the sinter paste including electrically conductive particles.

2. The interface layer as recited in claim 1, wherein the wires are copper wires.

3. The interface layer as recited in claim 1, wherein the particles have a composition, by weight, of greater than 99% copper.

4. The interface layer as recited in claim 1, wherein the mesh has a mesh size of 50-80.

5. The interface layer as recited in claim 4, wherein the wires have a wire diameter of 0.05 millimeters to 0.5 millimeters.

6. The interface layer as recited in claim 1, wherein the mesh is a plain weave.

7. The interface layer as recited in claim 1, wherein the wires are copper wires and the particles have a composition, by weight, of greater than 99% copper.

8. The interface layer as recited in claim 7, wherein the mesh is a plain weave.

9. The interface layer as recited in claim 8, wherein the mesh has a mesh size of 50-80 and the wires have a wire diameter of 0.05 millimeters to 0.5 millimeters.

10. The interface layer as recited in claim 1, wherein the mesh is a plain weave and has a mesh size of 50-80.

11. The interface layer as recited in claim 10, wherein the wires are copper wires.

12. The interface layer as recited in claim 11, wherein the particles have a composition, by weight, of greater than 99% copper.

13. The interface layer as recited in claim 12, wherein the wire has a wire diameter of 0.05 millimeters to 0.5 millimeters.

14. An electronic device comprising:
first and second components; and
an interface layer situated between the first and second components, the interface layer including,
an electrically conductive mesh having wires that are interwoven and pores between the wires, and
electrically conductive sintered bodies disposed in the pores.

15. The electronic device as recited in claim 14, wherein the wires are copper wires.

16. The electronic device as recited in claim 14, wherein the sintered bodies have a composition, by weight, of greater than 99% copper.

17. The electronic device as recited in claim 14, wherein the mesh is a plain weave.

18. The electronic device as recited in claim 14, wherein the interface layer has a thermal conductivity of 180 W/m° K to 260 W/m° K.

19. A method of fabricating an electronic device, the method comprising:
compressing an interface layer between first and second components to reduce a thickness of the interface layer, the interface layer including an electrically conductive mesh having wires that are interwoven, pores between the wires, and a sinter paste that is immobilized in the pores, the sinter paste including electrically conductive particles; and
heating the interface layer to consolidate the electrically conductive particles into sintered bodies in the pores.

20. The method as recited in claim 19, where the heating is conducted under an inert cover gas at a temperature of 225° C. to 300° C.

21. The method as recited in claim 19, wherein the heating is pressureless heating.

22. The method as recited in claim 19, wherein the heating is conducted under a pressure of 10 MPa to 40 Mpa.

* * * * *